(12) United States Patent
Lai et al.

(10) Patent No.: US 12,417,983 B2
(45) Date of Patent: Sep. 16, 2025

(54) SEMICONDUCTOR PACKAGE

(71) Applicant: SILICONWARE PRECISION INDUSTRIES CO., LTD., Taichung (TW)

(72) Inventors: Shu-Ting Lai, Taichung (TW); Chiu-Lien Li, Taichung (TW); Che-Min Su, Taichung (TW); Chun-Huan Hung, Taichung (TW); Mu-Hung Hsieh, Taichung (TW); Cheng-Han Yao, Taichung (TW); Fajanilan Darcyjo Directo, Taichung (TW); Cheng-Liang Hsu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 455 days.

(21) Appl. No.: 18/063,413

(22) Filed: Dec. 8, 2022

(65) Prior Publication Data
US 2024/0088054 A1 Mar. 14, 2024

(30) Foreign Application Priority Data
Sep. 8, 2022 (TW) .................. 111134136

(51) Int. Cl.
*H01L 23/544* (2006.01)
*H01L 23/00* (2006.01)
*H01L 23/31* (2006.01)

(52) U.S. Cl.
CPC ........ *H01L 23/544* (2013.01); *H01L 23/3157* (2013.01); *H01L 24/05* (2013.01); *H01L 24/13* (2013.01); *H01L 24/24* (2013.01); *H01L 2224/0401* (2013.01); *H01L 2224/05022* (2013.01); *H01L 2224/13006* (2013.01); *H01L 2224/13022* (2013.01); *H01L 2224/24225* (2013.01); *H01L 2924/182* (2013.01)

(58) Field of Classification Search
CPC .................................................... H01L 23/544
See application file for complete search history.

(56) References Cited

U.S. PATENT DOCUMENTS

| | | | | |
|---|---|---|---|---|
| 4,908,689 A | * | 3/1990 | McBride | H01L 24/81 257/E21.511 |
| 5,436,203 A | * | 7/1995 | Lin | H01L 23/24 29/841 |
| 6,614,122 B1 | * | 9/2003 | Dory | H01L 24/32 257/E21.503 |
| 7,177,155 B2 | * | 2/2007 | Lin | H01L 23/36 257/713 |

(Continued)

*Primary Examiner* — William A Harriston
(74) *Attorney, Agent, or Firm* — Studebaker Brackett PLLC

(57) ABSTRACT

A carrier structure is provided with a plurality of package substrates connected via connecting sections, and a functional element and a groove are formed on the connecting section, such that the groove is located between the package substrate and the functional element. Therefore, when a cladding layer covering a chip is formed on the package substrate, the groove can accommodate a glue material overflowing from the cladding layer to prevent the glue material from contaminating the functional element.

9 Claims, 3 Drawing Sheets

(56) References Cited

U.S. PATENT DOCUMENTS

| | | | |
|---|---|---|---|
| 7,359,211 B2* | 4/2008 | Landeros | B23K 3/0623 |
| | | | 361/783 |
| 8,952,552 B2* | 2/2015 | Zang | H01L 21/563 |
| | | | 257/737 |
| 2003/0192716 A1* | 10/2003 | Yamaguchi | H05K 3/284 |
| | | | 174/265 |
| 2004/0040742 A1* | 3/2004 | Ishizaki | H01L 21/563 |
| | | | 174/250 |
| 2005/0036291 A1* | 2/2005 | Huang | H01L 23/055 |
| | | | 257/E21.503 |
| 2005/0056926 A1* | 3/2005 | Chen | H01L 23/10 |
| | | | 257/E23.101 |
| 2005/0082682 A1* | 4/2005 | Liu | H01L 24/05 |
| | | | 438/109 |
| 2005/0195582 A1* | 9/2005 | Landeros | B23K 3/0623 |
| | | | 361/783 |
| 2011/0115083 A1* | 5/2011 | Zang | H01L 21/563 |
| | | | 257/E23.116 |
| 2011/0260338 A1* | 10/2011 | Lee | H01L 23/49811 |
| | | | 257/E21.511 |
| 2021/0384157 A1* | 12/2021 | Liao | H01L 24/83 |

* cited by examiner

SEMICONDUCTOR PACKAGE

BACKGROUND

1. Technical Field

The present disclosure relates to a semiconductor packaging process, and more particularly, to a carrier structure that can improve the reliability of the process.

2. Description of Related Art

In the early development of semiconductor packaging, a lead frame was used as a carrier for carrying active elements, the main reason being that the lead frame has the advantages of lower manufacturing cost and higher reliability. However, with the vigorous development of the electronic industry, electronic products are trending toward light, thin and short in terms of type and high-performance, high-functionality and high-speed in terms of function. Therefore, in order to meet the requirements of high integration and miniaturization of semiconductor devices, lead frames are gradually replaced by package substrates with high-density and fine-pitch circuits in the current packaging process.

As shown in FIG. 1A, in a conventional packaging process, a plurality of package substrates 10 are arrayed into a substrate strip 1, and a plurality of positioning holes 100 are formed on the periphery of the substrate strip 1 corresponding to the corners of each of the package substrates 10, and a plurality of test pads 101 and at least one barcode 102 are arranged on the edge of the substrate strip 1, so that in the subsequent packaging process, as shown in FIG. 1B, semiconductor chips 30 are arranged on each of the package substrates 10, and then the semiconductor chips 30 are covered with an encapsulant 32 to obtain a plurality of semiconductor packages 3, and then the batch number of each of the semiconductor packages 3 is identified via the barcode 102 to read the relevant information of the package substrate 10.

The package substrate 10 includes a plurality of dielectric layers 10b and a plurality of circuit layers 10a disposed on the plurality of dielectric layers 10b.

The semiconductor chip 30 is electrically connected to the plurality of circuit layers 10a via a plurality of conductive bumps 31 in a flip-chip manner, and the electrical connection between the semiconductor chip 30 and the plurality of circuit layers 10a is tested via the test pads 101.

However, when the conventional substrate strip 1 is in the packaging process, it is difficult to control the flow of the encapsulant 32, so that a glue material 320 of the encapsulant 32 easily overflows outside the package substrate 10 and often covers the test pads 101 or the barcodes 102, or even the positioning holes 100, causing the test pads 101 or the barcodes 102 to be stained, so that the test pads 101 or the barcodes 102 cannot be used subsequently.

Therefore, how to overcome the above-mentioned drawbacks of the prior art has become an urgent issue to be solved at present.

SUMMARY

In view of the various deficiencies of the prior art, the present disclosure provides a carrier structure, comprising: at least one package substrate; at least one connecting section adjacent to the package substrate; at least one functional element disposed on the connecting section; and at least one groove formed on the connecting section and located between the package substrate and the functional element.

In the aforementioned carrier structure, the package substrate has at least one dielectric layer and at least one circuit layer formed on the dielectric layer. The present disclosure further comprises an insulating protection layer formed on the outermost dielectric layer of the package substrate.

In the aforementioned carrier structure, the connecting section includes at least one insulating layer, and the functional element is formed on the insulating layer. For example, a depth of the groove is a thickness of the insulating layer.

In the aforementioned carrier structure, the connecting section is formed with a positioning hole corresponding to a corner of the package substrate.

In the aforementioned carrier structure, the functional element is a positioning hole, a test pad, or a barcode.

In the aforementioned carrier structure, a length of the groove is greater than or equal to a maximum corresponding length of a layout area of the functional element.

In the aforementioned carrier structure, a main distance is defined between a center of the functional element and an edge of the package substrate, and a target distance is defined between a center of the groove and the edge of the package substrate, such that a ratio of the target distance to the main distance is 0.3 to 0.5. Further, the ratio of the target distance to the main distance is 0.34 to 0.46.

As can be seen from the above, in the carrier structure of the present disclosure, the groove is arranged between the package substrate and the functional element, so as to accommodate the glue material overflowing from the encapsulant. Therefore, compared with the prior art, when the carrier structure of the present disclosure is in the packaging process, even if the glue material of the encapsulant overflows onto the connecting section outside the packaging substrate, the glue material will flow into the groove and will not spread to the functional element, such that the problem of contamination of the functional element can be avoided, so that the functional element can be effectively used in the future.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "upper," "one," "a," and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1A:
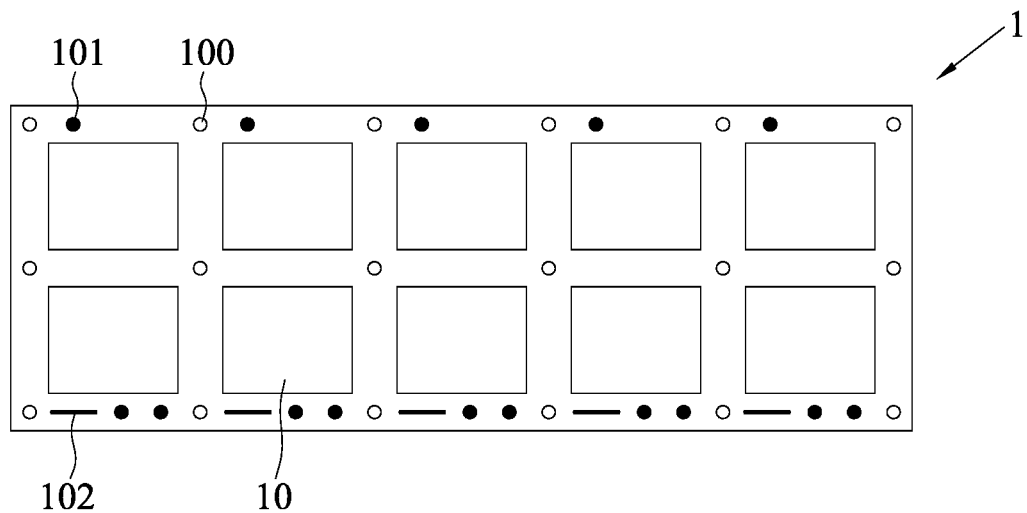
FIG. 1A is a schematic top plan view of a conventional substrate strip.
Figure 1B:
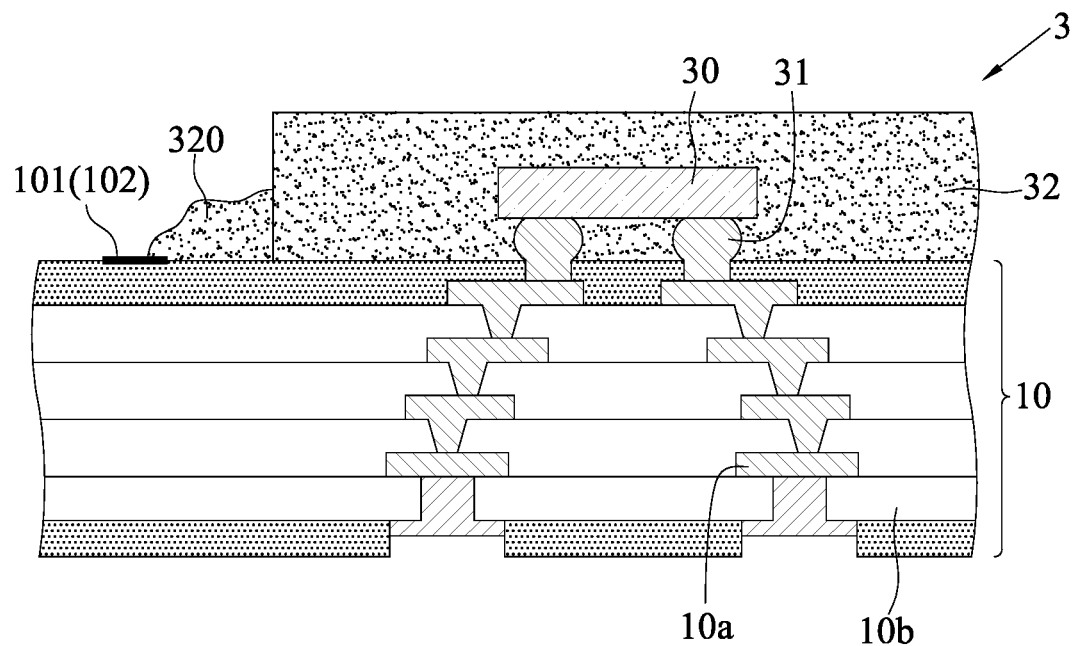
FIG. 1B is a schematic partial cross-sectional view of a conventional semiconductor package.
Figure 2A:
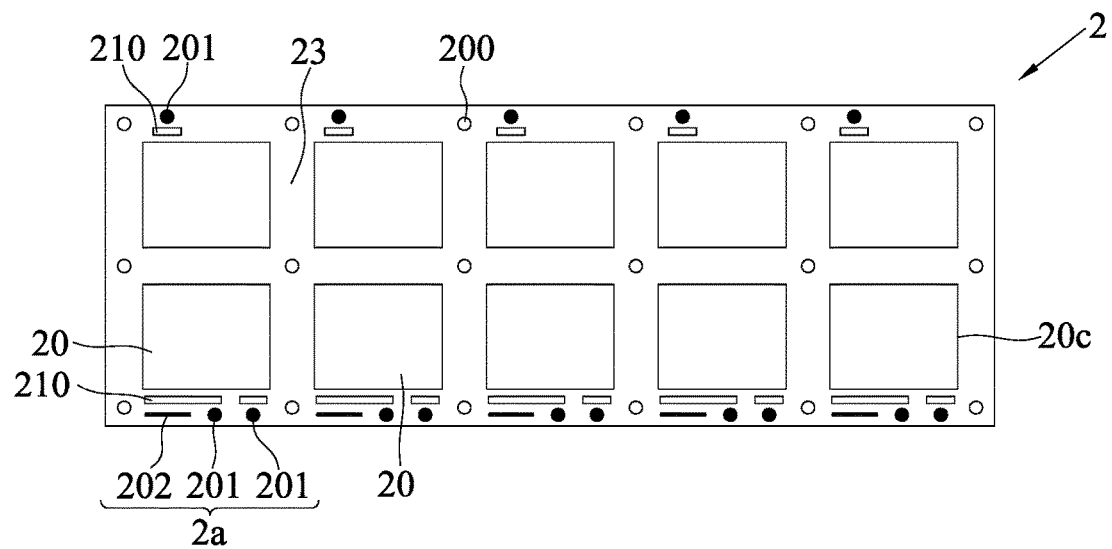
FIG. 2A is a schematic top plan view of a carrier structure according to the present disclosure.

FIG. 2A is a schematic top plan view of a carrier structure 2 according to the present disclosure. As shown in FIG. 2A, the carrier structure 2 includes: a plurality of package substrates 20 arranged in an array, a plurality of connecting sections 23 connected to the plurality of package substrates 20, and a plurality of grooves 210 disposed on the plurality of connecting sections 23.

In an embodiment, the carrier structure 2 is of a full-panel type, such as a substrate strip specification, and the connecting section 23 is configured with functional elements 2a, such as positioning holes 200, test pads 201, or a barcode 202, and a plurality of the positioning holes 200 are formed on an area of the connecting section 23 corresponding to the corners of each of the package substrates 20. For example, the positioning holes 200 are used for accommodating positioning pins on the machine table, and the positioning holes 200 are circular. However, there are many kinds of shapes and arrangement positions of the positioning holes 200, which can be designed according to requirements, and the present disclosure is not limited to as such.

Figure 2B:
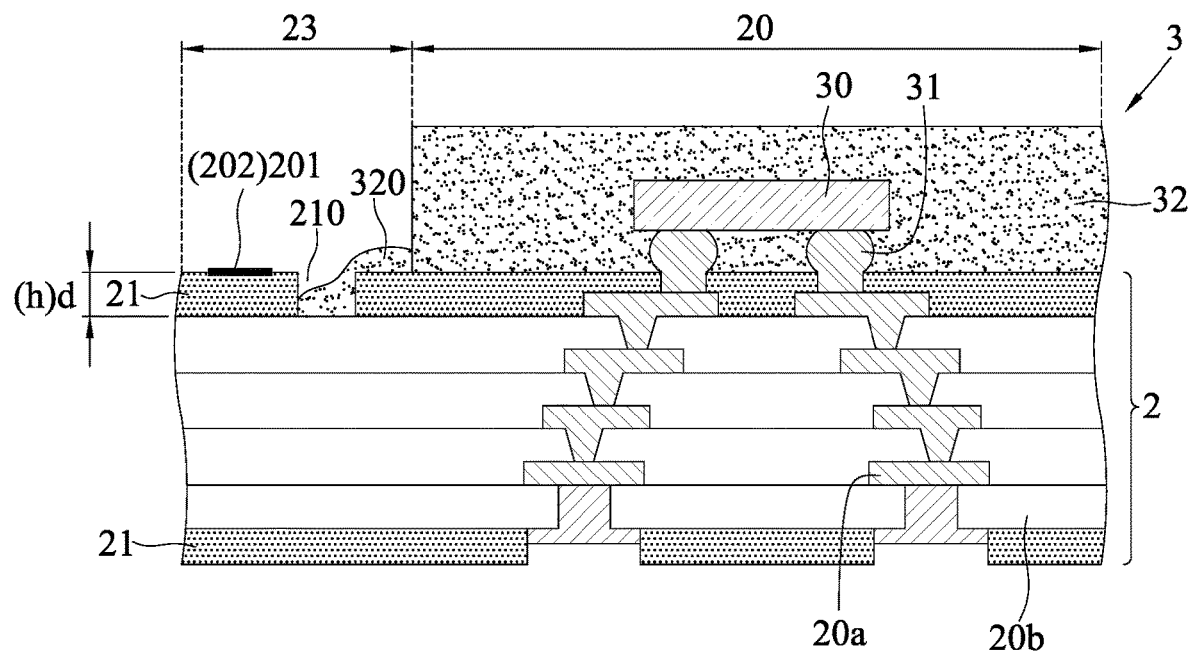
FIG. 2B is a schematic partial cross-sectional view of a semiconductor package made by the carrier structure according to the present disclosure.

Furthermore, the positioning holes 200 can also be used as an alignment mechanism in the subsequent packaging process. For example, when placing an electronic element such as a semiconductor chip 30 (as shown in FIG. 2B) on the package substrate 20, the electronic element can be aligned via the positioning holes 200; alternatively, when performing a lamination process or a molding process, the upper and lower molds can be accurately positioned on the carrier structure 2 via the positioning holes 200 to facilitate the formation of a cladding layer (such as the encapsulant 32 as shown in FIG. 2B) for covering the electronic element.

In addition, the electronic elements are arranged on each of the package substrates 20 according to the required number, and the electronic elements can be active elements, passive elements, or combinations thereof, etc., wherein the active elements are, for example, semiconductor chips, and the passive elements are, for example, resistors, capacitors, and inductors. For example, the electronic element is a semiconductor chip, which can be electrically connected to the package substrate 20 by wire bonding; alternatively, the electronic element can be disposed on the package substrate 20 in a flip-chip manner via the plurality of conductive bumps 31 (as shown in FIG. 2B); or, the electronic element can be embedded in the package substrate 20. It should be understood that there are many ways to configure the electronic element and electrically connect the package substrate 20, and the present disclosure is not limited to as such.

In addition, the cladding layer is made from an insulating material, such as polyimide (PI), dry film, epoxy resin, molding compound, or other encapsulant 32, and the present disclosure is not limited to as such.

Therefore, the carrier structure 2 can be applied to a semiconductor packaging process to obtain a plurality of semiconductor packages 3.

The package substrate 20 is a circuit structure with a core layer or a coreless circuit structure, wherein the package substrate 20 has at least one dielectric layer 20b and at least one circuit layer 20a (such as a fan-out type redistribution layer [RDL]) disposed on the dielectric layer 20b, and an insulating protection layer 21 such as a solder mask layer is formed on the outermost dielectric layer 20b.

In an embodiment, the package substrate 20 is rectangular, and the main material for forming the dielectric layer 20b is polybenzoxazole (PBO), polyimide (PI), prepreg (PP) and other dielectric materials. It should be understood that the package substrate 20 can be selected to form the insulating protection layer 21 or not to form the insulating protection layer 21 according to requirements.

However, the package substrate 20 may also be other carriers for carrying chips, such as organic plates, semiconductor materials, or other carrier plates with metal routing, and the present disclosure is not limited to as such.

The connecting section 23 is disposed around the edge 20c of the package substrate 20, and the connecting section 23 includes at least one insulating layer, so that the functional element 2a is formed on the insulating layer.

In an embodiment, the structure of the connecting section 23 can be fabricated according to the process and structure of the package substrate 20. For example, the insulating layer can be the dielectric layer 20b and/or the insulating protection layer 21, without forming a circuit layer, so that the functional element 2a and the positioning hole 200 are formed on the insulating protection layer 21.

Furthermore, the connecting section 23 may form a circuit layer 20a at which corresponds to each positioning hole 200, so that the positioning pin contacts the circuit layer 20a in the positioning hole 200 for grounding and antistatic.

In addition, the connecting section 23 is defined between each of the package substrates 20 as a cutting path for the singulation process.

The groove 210 is formed on the insulating protection layer 21 and located between the package substrate 20 and the functional element 2a.

In an embodiment, the depth h of the groove 210 is the thickness d of a single insulating layer (such as the insulating protection layer 21), such that the groove 210 penetrates through the single insulating layer (or as shown in FIG. 2B, the surface of the dielectric layer 20b is exposed).

Figure 3A:
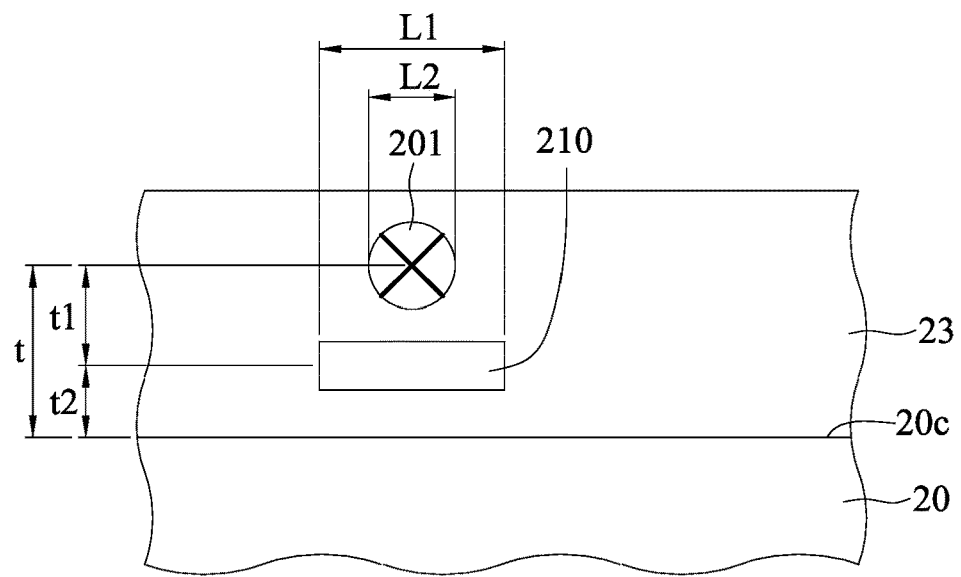
FIG. 3A and FIG. 3B are schematic partially enlarged views of FIG. 2A.
Figure 3B:
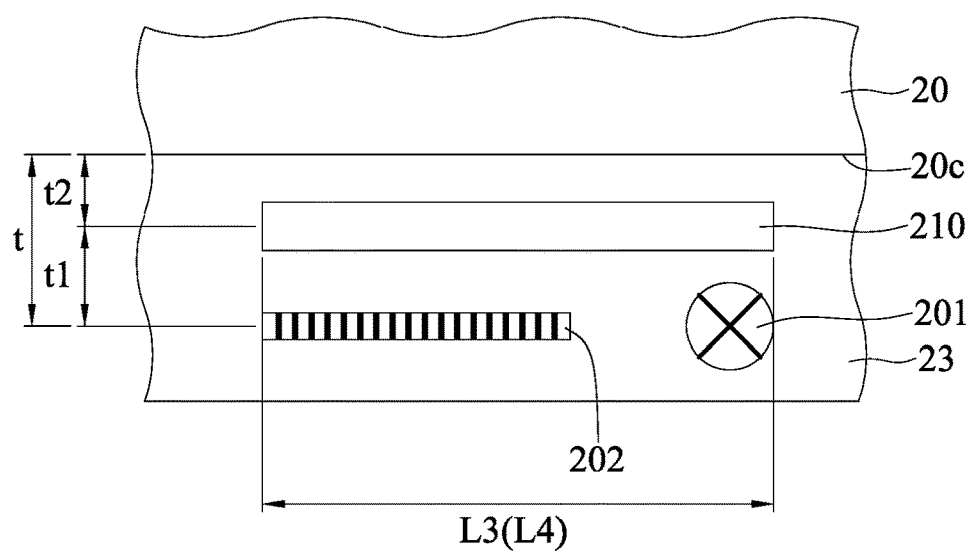

Please refer to FIG. 3A and FIG. 3B together, lengths L1 and L3 of the groove 210 are greater than or equal to the maximum corresponding lengths L2 and L4 of the layout area of the functional element 2a. For example, the arrangement range of the groove 210 corresponds to the test pad 201, as shown in FIG. 3A, so that the length L1 of the groove 210 is greater than or equal to the maximum corresponding length L2 of the test pad 201. Alternatively, as shown in FIG. 3B, the arrangement range of the groove 210 can correspond to the test pad 201 and the barcode 202 together, so that the length L3 of the groove 210 is greater than or equal to the maximum corresponding length L4 of the layout area of the test pad 201 and the barcode 202.

In addition, as shown in FIG. 3A or FIG. 3B, the groove 210 is rectangular, wherein a main distance t is defined between the center of the functional element 2a (such as the test pad 201 or the barcode 202) and the edge 20c of the package substrate 20, a first distance t1 is defined between the center of the groove 210 and the center of the functional element 2a, and a second distance t2 is defined between the center of the groove 210 and the edge 20c of the package substrate 20, so that the second distance t2 is used as a target distance, and the ratio of the second distance t2 to the main distance t is 0.3 to 0.5, that is, t2/(t1+t2)=0.3 to 0.5, preferably 0.34 to 0.46. It should be understood that the edge 20c of the package substrate 20 is the boundary between the package substrate 20 and the connecting section 23.

Therefore, in the carrier structure 2 of the present disclosure, the groove 210 is arranged between the package substrate 20 and the functional element 2a, so as to accommodate the glue material 320 overflowing from the encapsulant 32. Therefore, compared with the prior art, when the carrier structure 2 of the present disclosure is in the packaging process, even if the glue material 320 of the encapsulant 32 overflows onto the connecting section 23 outside the package substrate 20, the glue material 320 will flow into the groove 210 and will not spread to the functional element 2a, such that the problem of contamination of the functional element 2a can be avoided, so that the functional element 2a can be effectively used in the future.

Furthermore, the depth h or the lengths L1, L3 of the groove 210 can match the amount of the overflowing glue material 320 in the subsequent packaging process, so that the glue material 320 cannot cover part or all of the surface of the functional element 2a.

Furthermore, the position of the groove 210 can be adjusted according to the flow range of the glue material 320, so that the ratio of the second distance t2 (target distance) to the main distance t is 0.3 to 0.5, preferably 0.34 to 0.46, so that the glue material 320 cannot cover part or all of the surface of the functional element 2a.

To sum up, the carrier structure of the present disclosure can effectively prevent the glue material of the cladding layer from contacting the functional element via the design of the groove. Therefore, in the semiconductor packaging process, the carrier structure of the present disclosure can effectively use the test pad or the barcode, so as to improve the yield and production capacity of the semiconductor packaging process.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A semiconductor package, comprising:
   at least one package substrate;
   an electronic element disposed on the package substrate;
   a cladding layer covering the electronic element;
   at least one connecting section adjacent to the package substrate;
   at least one functional element disposed on the connecting section; and
   at least one groove formed on the connecting section and located between the package substrate and the functional element, wherein the groove accommodates a part of a glue material of the cladding layer so that the glue material does not contact the functional element.

2. The semiconductor package of claim 1, wherein the package substrate has at least one dielectric layer and at least one circuit layer formed on the dielectric layer.

3. The semiconductor package of claim 2, further comprising an insulating protection layer formed on the outermost dielectric layer of the package substrate.

4. The semiconductor package of claim 1, wherein the connecting section includes at least one insulating layer, and the functional element is formed on the insulating layer.

5. The semiconductor package of claim 4, wherein a depth of the groove is a thickness of the insulating layer.

6. The semiconductor package of claim 1, wherein the functional element is a positioning hole, a test pad, or a barcode.

7. The semiconductor package of claim 1, wherein a length of the groove is greater than or equal to a maximum corresponding length of a layout area of the functional element.

8. The semiconductor package of claim 1, wherein a main distance is defined between a center of the functional element and an edge of the package substrate, and a target distance is defined between a center of the groove and the edge of the package substrate, such that a ratio of the target distance to the main distance is 0.3 to 0.5.

9. The semiconductor package of claim 8, wherein the ratio of the target distance to the main distance is 0.34 to 0.46.

* * * * *